US008586128B2

(12) United States Patent
Shin et al.

(10) Patent No.: US 8,586,128 B2
(45) Date of Patent: Nov. 19, 2013

(54) LIGHT EMITTING DIODE PACKAGE HAVING MULTI-STEPPED REFLECTING SURFACE STRUCTURE AND FABRICATION METHOD THEREOF

(75) Inventors: Sang Hyun Shin, Gyunggi-Do (KR); Seog Moon Choi, Seoul (KR); Young Ki Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 178 days.

(21) Appl. No.: 12/467,513

(22) Filed: May 18, 2009

(65) Prior Publication Data
US 2009/0227050 A1 Sep. 10, 2009

Related U.S. Application Data

(62) Division of application No. 11/783,948, filed on Apr. 13, 2007, now Pat. No. 7,547,923.

(30) Foreign Application Priority Data

Apr. 21, 2006 (KR) .................. 10-2006-0036099

(51) Int. Cl.
*B05D 5/12* (2006.01)
(52) U.S. Cl.
USPC .................. 427/64; 427/74; 427/77
(58) Field of Classification Search
USPC ............... 427/74, 77, 64
See application file for complete search history.

(56) References Cited

U.S. PATENT DOCUMENTS

| 6,160,270 | A | 12/2000 | Holmberg et al. | |
| 6,342,402 | B1* | 1/2002 | Tajiri et al. | ............... 438/34 |
| 7,029,156 | B2 | 4/2006 | Suehiro et al. | |
| 7,268,014 | B2 | 9/2007 | Lee et al. | |
| 7,777,247 | B2* | 8/2010 | Loh et al. | ............... 257/100 |

(Continued)

FOREIGN PATENT DOCUMENTS

| JP | 07-038154 A | 2/1995 |
| JP | 07-176795 A | 7/1995 |

(Continued)

OTHER PUBLICATIONS

Taiwanese Office Action, with English translation, issued in Taiwanese Patent Application No. 096113423, mailed Jun. 28, 2010.

(Continued)

*Primary Examiner* — Brian K Talbot
(74) *Attorney, Agent, or Firm* — McDermott Will & Emery LLP

(57) ABSTRACT

A high luminance and high output LED package using an LED as a light source and a fabrication method thereof. The LED package includes an Al substrate with a recessed multi-stepped reflecting surface formed therein and a light source composed of LEDs mounted on the reflecting surface and electrically connected to patterned electrodes. The LED package also includes anodized insulation layers formed between the patterned electrodes and the substrate, and an encapsulant covering over the light source of the substrate. The LED package further includes an Al heat radiator formed under the LEDs to enhance heat radiation capacity. According to the present invention, the substrate is made of Al material and anodized to form insulation layers thereon, allowing superior heat radiation effect of the LED, thereby significantly increasing the lifetime and light emission efficiency of the LED package.

5 Claims, 7 Drawing Sheets

(56) References Cited

U.S. PATENT DOCUMENTS

| | | | |
|---|---|---|---|
| 2003/0098459 A1 | 5/2003 | Horiuchi et al. | |
| 2004/0188719 A1* | 9/2004 | Nawashiro et al. | 257/200 |
| 2004/0208210 A1 | 10/2004 | Inoguchi | |
| 2007/0034323 A1* | 2/2007 | Hiller et al. | 156/230 |
| 2007/0097684 A1* | 5/2007 | Obara et al. | 362/249 |

FOREIGN PATENT DOCUMENTS

| | | | |
|---|---|---|---|
| JP | 08-242020 | * | 9/1996 |
| JP | 10-223817 | | 8/1998 |
| JP | 2001-352105 | | 12/2001 |
| JP | 2003-152226 | | 5/2003 |
| JP | 2003-163378 | | 6/2003 |
| JP | 2003-218398 | | 7/2003 |
| JP | 2004-111906 | * | 4/2004 |
| JP | 2004-253404 | | 9/2004 |
| JP | 2004-282004 | | 10/2004 |
| JP | 2004-288935 | * | 10/2004 |
| JP | 2004-311791 A | | 11/2004 |
| JP | 2006-060034 | | 3/2006 |
| JP | 2007-505493 A | | 3/2007 |
| WO | WO 2005/002733 | * | 3/2005 |
| WO | WO-2005-027233 A2 | | 3/2005 |
| WO | WO 2005/027233 A2 | | 3/2005 |

OTHER PUBLICATIONS

Japanese Office Action, w/ English translation thereof, issued in Japanese Patent Application No. JP 2007-111482 dated Sep. 28, 2010.

Japanese Office Action issued in Japanese Patent Application No. 2007-111482, mailed Mar. 15, 2011.

Japanese Patent Court Decision, and English translation thereof, issued in Japanese Patent Application No. 2007-111482 dated Dec. 8, 2011.

Office Action issued Nov. 27, 2012 in co-pending Japanese patent application No. 2011-156645.

* cited by examiner

LIGHT EMITTING DIODE PACKAGE HAVING MULTI-STEPPED REFLECTING SURFACE STRUCTURE AND FABRICATION METHOD THEREOF

CLAIM OF PRIORITY

This application is a divisional of U.S. application Ser. No. 11/783,948, filed on Apr. 13, 2007 now U.S. Pat. No. 7,547,923, which claims the benefit of Korean Application No. 10-2006-0036099, filed on Apr. 21, 2006, the contents of which are hereby incorporated by reference.

BACKGROUND OF THE INVENTION

1. Field of the Invention

The present invention relates to a high luminance and high output Light Emitting Diode (LED) package using an LED as a light source. More particularly, the invention relates to an LED package having a multi-stepped reflecting surface structure, in which a light source is mounted on an aluminum (Al) substrate and a multi-stepped reflecting surface is integrally formed around the light source to improve the light efficiency and heat radiation effect of an LED during light emitting operation, thereby prolonging the lifetime of the LED while maintaining high luminance and high output of the LED package, and a fabrication method thereof.

2. Description of the Related Art

As shown in FIG. 1, in a conventional LED package 300 using an LED as a light source, an LED 315 is mounted on a substrate 310 and electrically connected to power to emit light.

In such an LED package 300, the LED 315 generates light according to its characteristics and heat at the same time. Thus, the heat should be discharged effectively to the outside to prevent overheating, thereby maintaining a long lifetime and good output efficiency.

In the conventional LED package 300, the LED 315 is mounted as a light source on a circuit board 310 having fixed electrode patterns 305, and a reflecting member 320 having roughly the same size as the exterior of the substrate 310 and having a radial reflector 322 formed therein, is integrally fixed to the upper side of the substrate with an epoxy resin, etc.

Such a conventional LED package 300 has the inclined reflecting surface 322 penetrating the reflecting member 320, and the light from the LED 315 is reflected forward by the reflecting surface 322.

However, the conventional LED package 300 does not use a highly heat conductive material, i.e., a metallic material with superior heat radiation capacity, for example, Al for the substrate 310, and thus superior heat radiation effect does not take place during the light emitting operation of the LED 315.

Furthermore, the conventional LED package 300 has the reflecting member 320 fixed by a separate process to the substrate 310, hindering simplification of the manufacturing process with increased assembly costs.

SUMMARY OF THE INVENTION

The present invention has been made to solve the foregoing problems of the prior art and therefore an aspect of the present invention is to provide an LED package which has a multi-stepped reflecting surface formed integrally in a substrate to simplify the manufacturing process and reduce the manufacturing costs, and a fabrication method thereof.

Another aspect of the invention is to provide an LED package which has a multi-stepped reflecting surface structure to achieve superior heat radiation effect through a substrate, allowing application to low power and high power LED chips, thereby significantly increasing the lifetime and light emission efficiency, and a fabrication method thereof.

According to an aspect of the invention, the invention provides a light emitting diode package which includes: an Al substrate having a recessed multi-stepped reflecting surface formed in a side thereof; a light source comprising light emitting diodes mounted on the reflecting surface and electrically connected to patterned electrodes; anodized insulation layers formed between the patterned electrodes and the substrate; an encapsulant covering over the light source of the substrate; and an Al heat radiator formed under the light emitting diodes of the light source to improve heat radiation capacity.

Preferably, the multi-stepped reflecting surface is coated with highly reflective Ag.

In addition, preferably, the reflecting surface is defined by a recessed space in the Al substrate and comprises a planar central reflecting surface portion, on which the light source is seated, and inclined reflecting surface portions surrounding the central reflecting surface portion.

According to another aspect of the invention, the invention provides a method of fabricating an LED package having a multi-stepped reflecting surface structure. The method includes:

etching a surface of a substrate to integrally form a reflecting surface;

anodizing surfaces of the substrate to form insulation layers;

coating a highly reflective metallic material on the reflecting surface; forming patterned electrodes on the insulation layers of the substrate;

mounting a light source on the substrate and electrically connecting the light source to the patterned electrodes; and forming an encapsulant over the light source of the substrate.

Preferably, the etching step includes: forming a first photoresist layer on a surface of the substrate and selectively etching the surface of the substrate to form a first inclined reflecting surface portion; and forming a second photoresist layer on an inner side of the first inclined reflecting surface portion and selectively etching the inner side surface of the substrate to form a second inclined reflecting surface portion and a central reflecting surface portion on which the light source is seated.

Preferably, the encapsulant forming step includes dispensing and curing a transparent material selected from the group consisting of a silicone resin, an epoxy resin, an Epoxy Molding Compound (EMC) and mixtures thereof in a recessed space of the reflecting surface of the substrate.

Preferably, the method according to the present invention further includes dicing a mother substrate to produce a plurality of LED packages.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
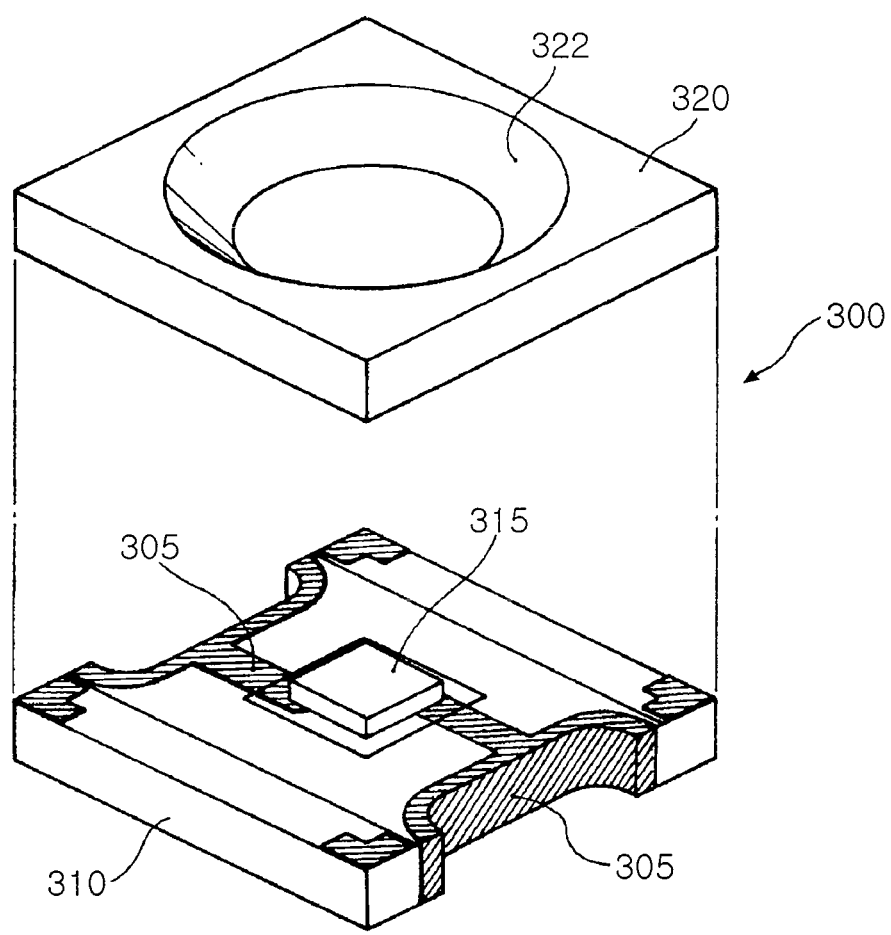
FIG. 1 is a perspective view illustrating a conventional LED package.
Figure 2:
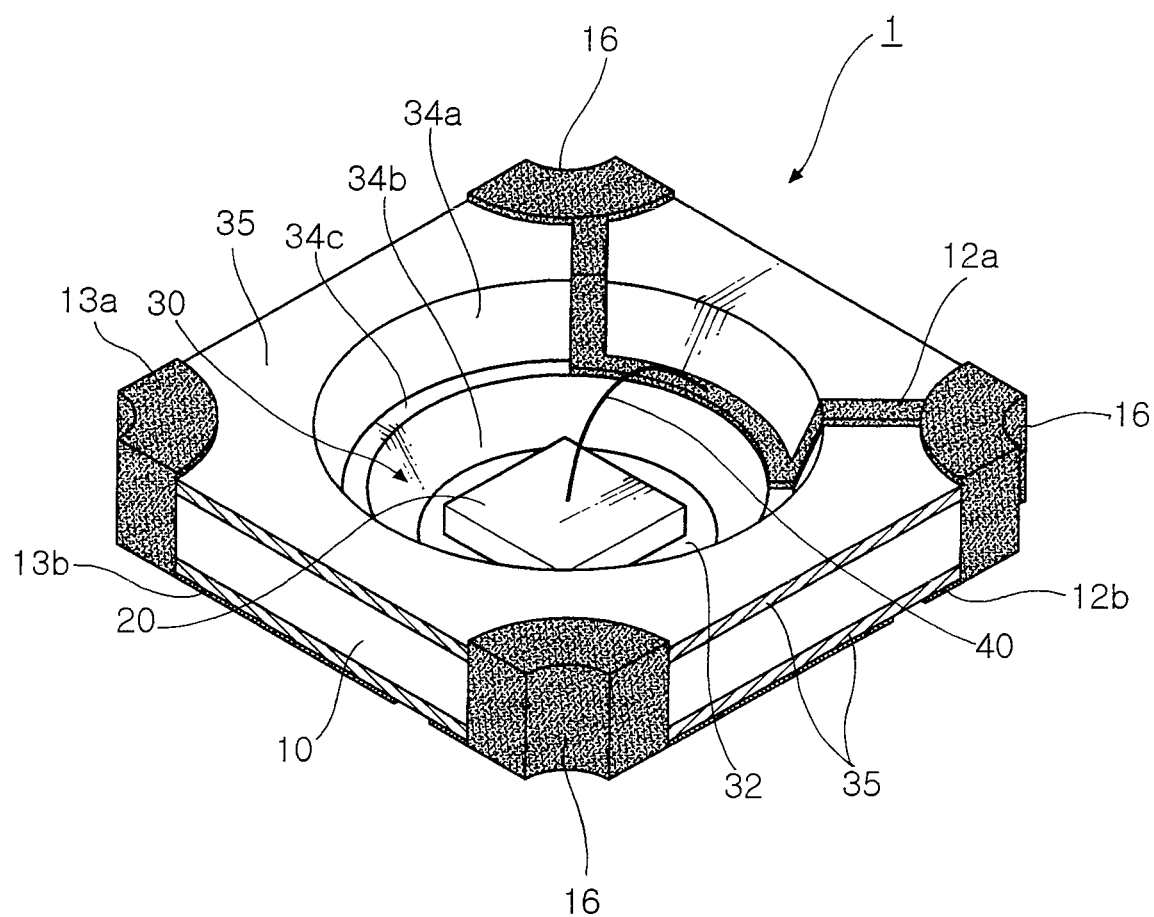
FIG. 2 is a perspective view illustrating an exterior of an LED package having a multi-stepped reflecting surface according to the present invention.

An LED package 1 having a multi-stepped reflecting surface structure according to the present invention includes a substrate 10 made of an Al material, as shown in FIG. 2. The substrate 10 is made of an Al material which is relatively low-cost and easily manufactured.

Such a substrate 10 has a reflecting surface 30 formed in a center thereof. The reflecting surface 30 is defined by a recess formed by etching the substrate 10, and includes a planar central reflecting surface portion 32, on which the light source 20 described later is seated, i.e., a die bonding reflecting surface portion and inclined reflecting surface portions 34a and 34b, surrounding the central reflecting surface portion 32, formed in multiple steps.

In addition, an Ag material, which is highly reflective, is coated on the inclined reflecting surface portions 34a and 34b to further improve light efficiency.

In addition, patterned electrodes 12a, 12b, 13a and 13b are formed on the substrate 10 to supply power to the light source 20. The patterned electrodes 12a and 13a are formed on surfaces of the side of the substrate 10 where the reflecting surface 30 is formed to electrically connect the LED constituting the light source 20, whereas the patterned electrodes 12b and 13b formed on the opposite side (underside surface) function as an electric connection pad of the LED package 1 mounted on another substrate (not shown) as a Surface Mounted Device (SMD).

The patterned electrodes 12a, 12b, 13a and 13b formed on opposed sides of the substrate are electrically connected through a plurality of vias 16 penetrating the substrate 10.

The vias 16 are formed by drilling, using a laser, etching and the like, and the surface of the vias 16 can be plated with Ni, Cu, Au and Ag so as to electrically connect the patterned electrodes 12a, 12b, 13a and 13b of the substrate 10. The vias 16 can have sectional shapes such as a circle, rectangle and a triangle.

In addition, the LED package 1 having a multi-stepped reflecting surface structure according to the present invention includes anodized insulation layers 35 formed between the patterned electrodes 12a, 12b, 13a and 13b and the substrate 10.

The anodized insulation layers 35 for the purpose of insulating the electrode patterns 12a, 12b, 13a and 13b from the substrate 10 are formed by treating the substrate 10 locally or partially with $Al_2O_3$ through anodizing or anodic-oxidizing the Al substrate 10 in a thickness of about 10 to 100 μm.

The anodized insulation layer 35, which has a porous structure, has somewhat low heat conducting capacity but has superior electrical insulation capacity, and thus used as an insulation layer. The anodized insulation layers 35 are formed between the patterned electrodes 12a, 12b, 13a and 13b and the substrate 10 to allow the patterned electrodes 12a, 12b, 13a and 13b to supply power necessary for light emitting operation of the light source 20. The anodized insulation layers 35 are formed in the vias 16 as well to electrically insulate the substrate 10 from the electrodes.

Figure 3:
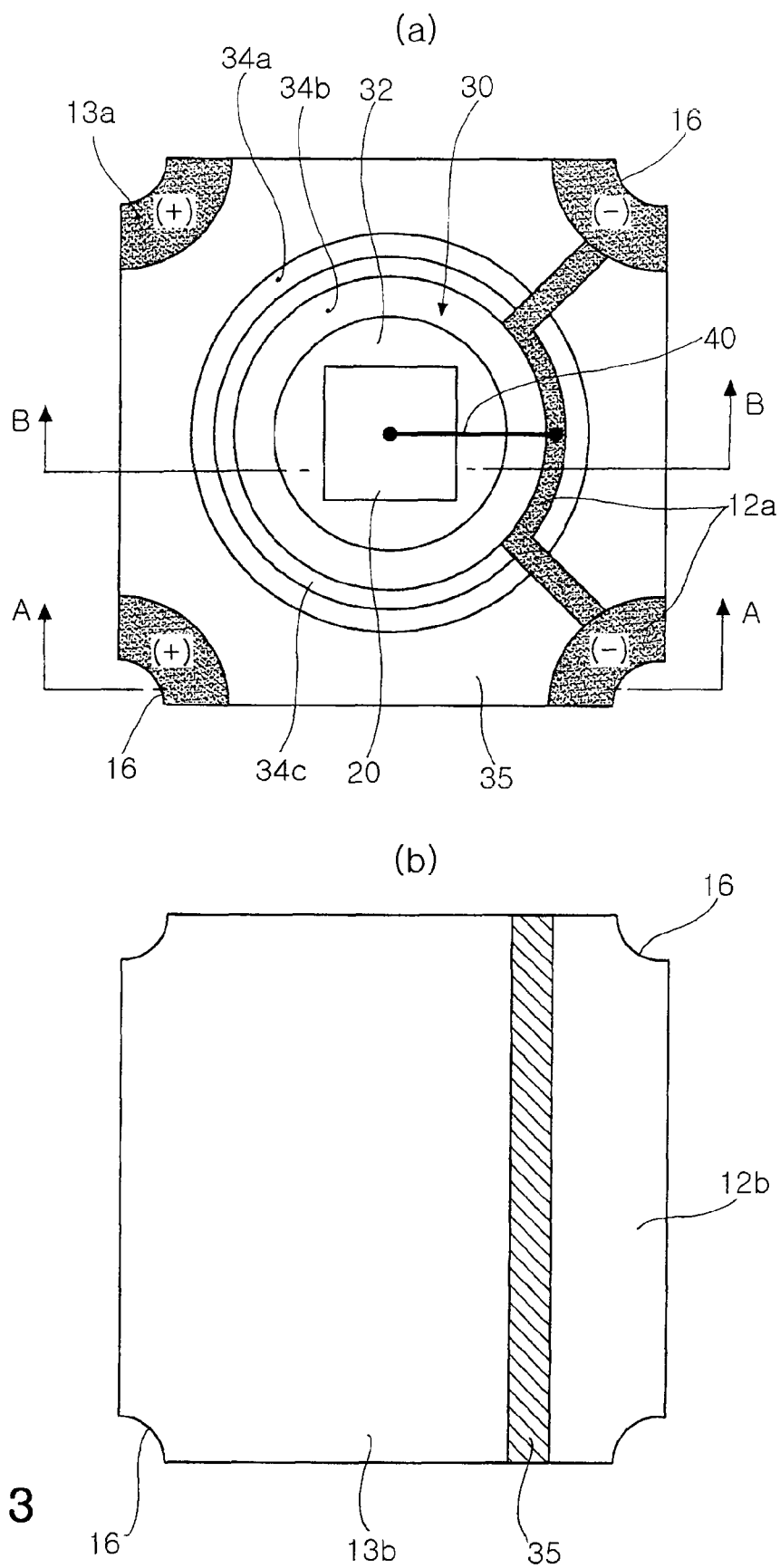
FIG. 3 is a plan view illustrating the LED package having a multi-stepped reflecting surface structure according to the present invention, in which (a) is a plan view of an upper part thereof and (b) is a plan view of a bottom part thereof.
Figure 4:
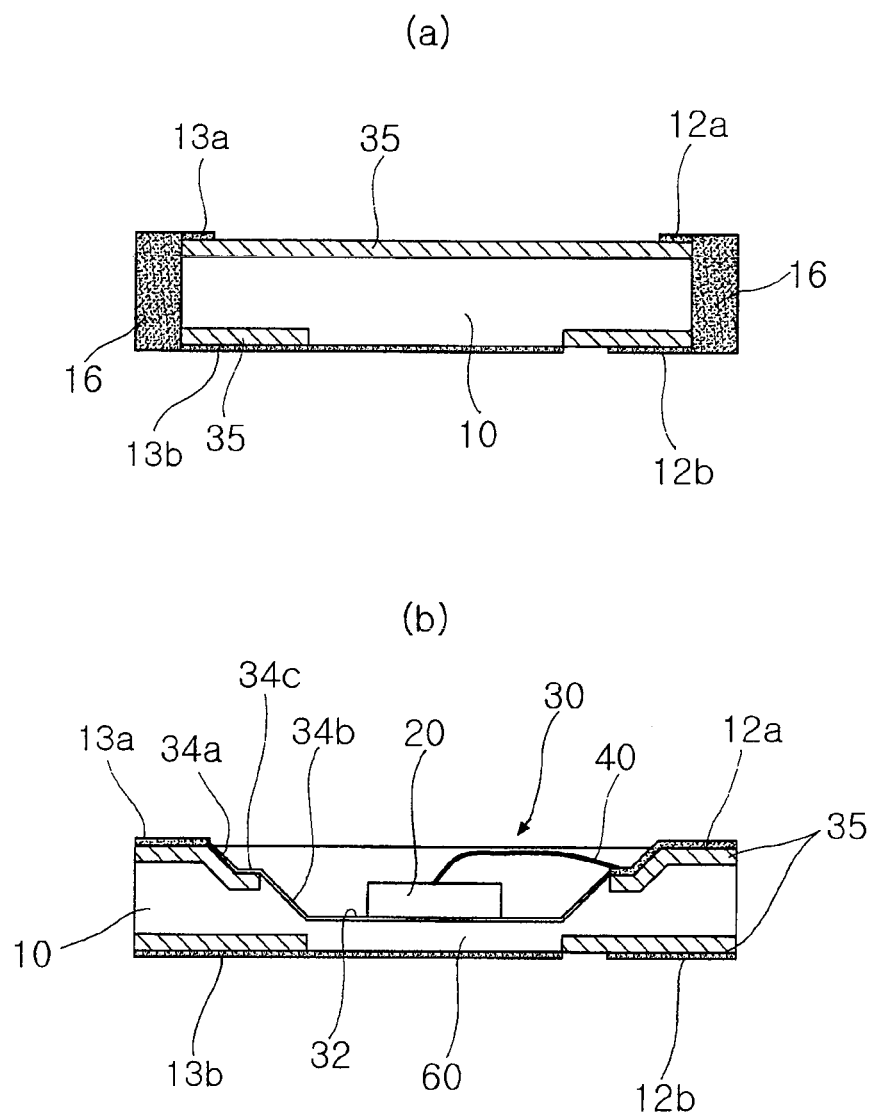
FIG. 4 is a side sectional view illustrating the LED package having a multi-stepped reflecting surface structure according to the present invention, in which (a) is a sectional view cut along the line A-A of FIG. 3 and (b) is a sectional view cut along the line B-B of FIG. 3.

In the case of the LED package according to the present invention shown in FIGS. 3 and 4, the upper patterned electrodes 12a extend from an upper part of the substrate 10 to a middle step 34c of the multi-stepped reflecting surface 30, and is electrically connected to the lower patterned electrodes 12b through plating layers of the via 16, providing negative (−) electrodes. The patterned electrodes 12a are insulated from the substrate by the anodized insulation layers 35 and are electrically connected to the light source by a wire 40.

On the other hand, the patterned electrodes 13a are formed on the anodized insulation layers 35 which are formed on an upper surface, a lower surface and the vias to provide positive (+) electrodes. Also, the lower patterned electrodes 13b are directly formed on lower surfaces of the substrate 10 to provide a positive (+) electrode from an external power source (not shown) to the substrate 10. Therefore, the substrate 10 forms electric connection of a positive (+) electrode on a lower terminal of the light source 20 fixed in the center of the reflecting surface 30.

The patterned electrodes 12a and 12b; 13a and 13b exemplified in FIGS. 3 and 4 are merely an illustrative structure of the present invention, and do not limit the present invention. Other various arrangements of electrode patterns and anodized insulation layers can be applied to form electric connection of the light source.

Moreover, according to the invention, the light source can be composed of blue, red and green LEDs to produce white light. Each of these LEDs can be connected to a positive (+) or a negative (−) electric terminal provided from the substrate and the patterned electrodes by the wires 40.

As described above, various forms of patterned electrodes 12a, 12b, 13a and 13b are designed and insulated from the substrate 10 by the anodized insulation layers 35 while providing power to the light source 20.

Figure 5:
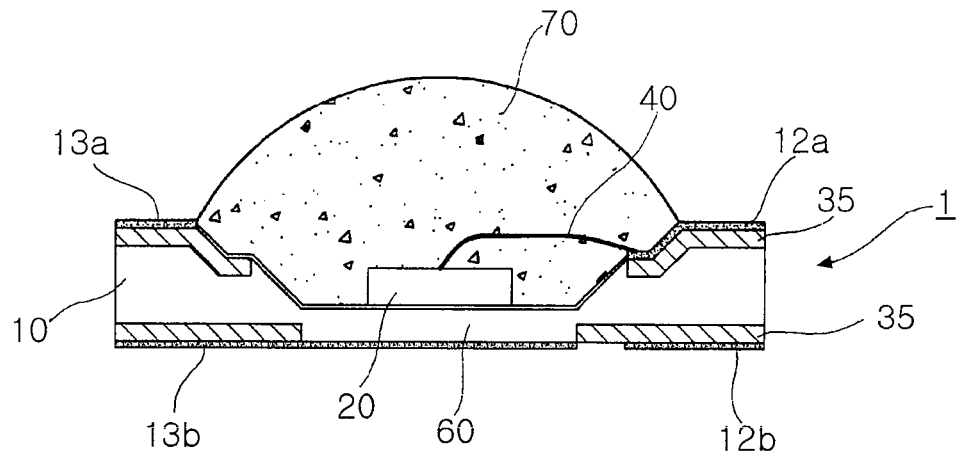
FIG. 5 are side views illustrating several embodiments of the LED package having a multi-stepped reflecting surface structure according to the present invention, in which (a) is a side view with the encapsulant with a hemispheric upper surface covering the multi-stepped reflecting surface portions, (b) is a side view with the encapsulant with a hemispheric upper surface covering only a single reflecting surface portion, and (c) is a side view with the encapsulant with a planar upper surface covering multi-stepped reflecting surface portions.
Figure 5:
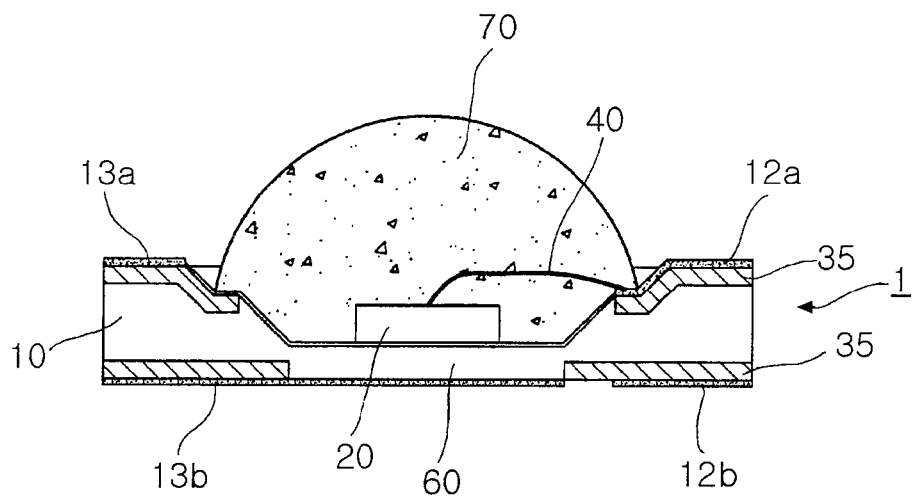
Figure 5:
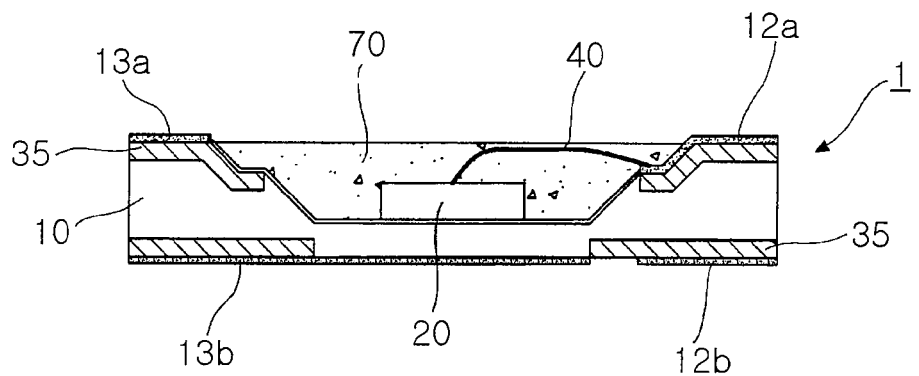

In addition, the LED package 1 having a multi-stepped surface structure according to the present invention includes an encapsulant 70 covering over the light source 20 of the substrate 10. As shown in FIG. 5, the encapsulant 70 is formed by dispensing a transparent material selected from the group consisting of a silicone resin, an epoxy resin, an Epoxy Molding Compound (EMC) and mixtures thereof in a space of the reflecting surface 30 of the substrate 10.

As shown in FIG. 5(a), such an encapsulant 70 with a hemispheric upper surface may cover first, second or more steps of reflecting surface portions 34a and 34b, or as shown in FIG. 5(b), may cover only a second inclined reflecting surface portion 34b.

In addition, as shown in FIG. 5(c), the encapsulant 70 may cover first, second or more steps of reflecting surface portions 34a and 34b but with a planar upper surface.

The LED package 1 having a multi-stepped reflecting surface structure according to the present invention further includes a heat radiator (heat radiation region) 60 made of an Al material under the light source 20, thus possessing superior heat radiation capacity.

A method of fabricating an LED package having a multi-stepped reflecting surface structure according to the present invention entails the following steps.

Figure 6:
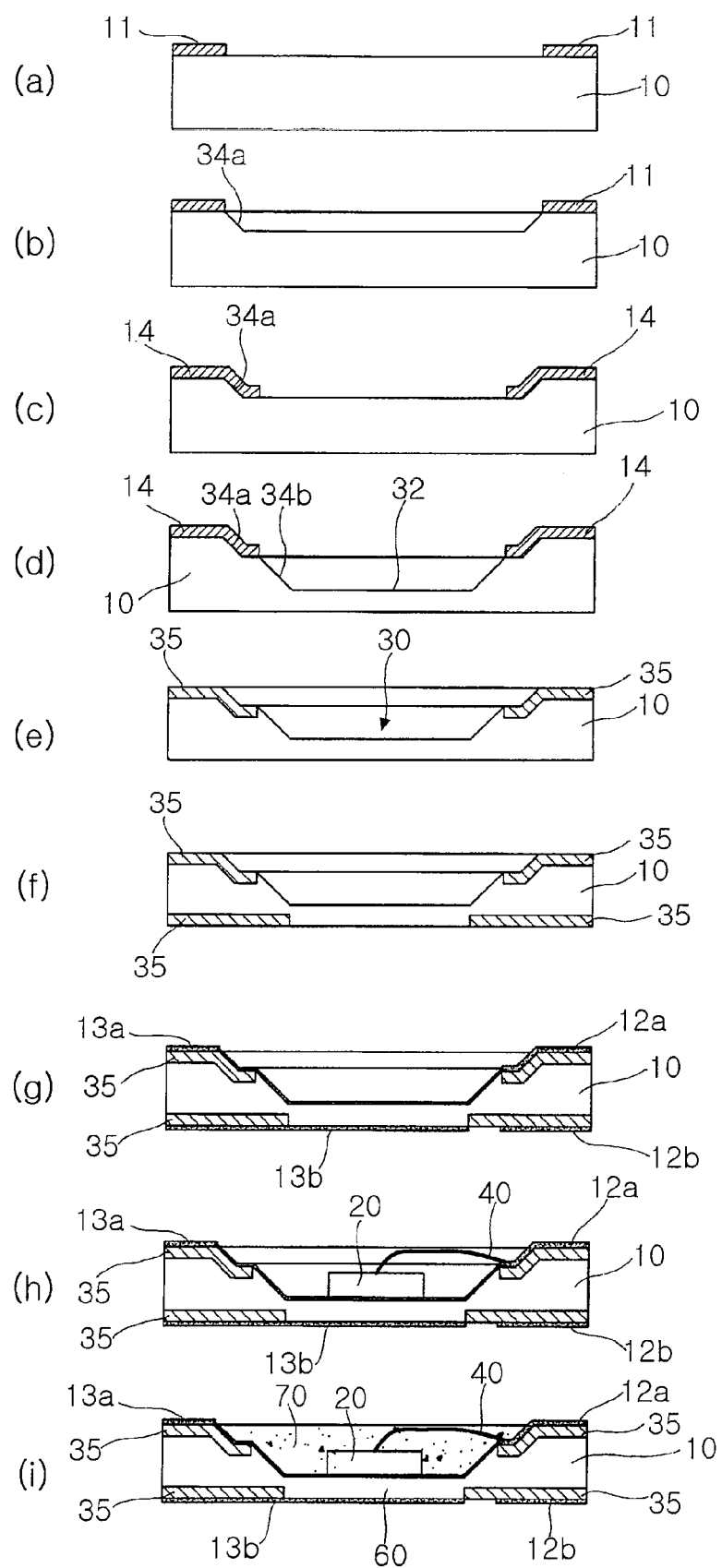
FIG. 6 is a view illustrating a stepwise fabrication method of the LED package having a multi-stepped reflecting surface structure according to the present invention.

First, as shown in FIG. 6, a surface of the substrate 10 is etched to form a multi-stepped reflecting surface 30.

The reflecting surface 30 includes a planar central reflecting surface portion 32, on which the light source 20 is seated, and inclined reflecting surface portions 34a and 34b surrounding the central reflecting surface portion 32. The reflecting surface is formed by, as shown in FIG. 6(a) to 6(d), forming a first photoresist layer 11 on a surface of the Al substrate 10 and selectively etching the surface of the Al substrate 10 to form a first inclined reflecting surface portion 34a.

Then, in order to form a second inclined reflecting surface portion 34b on the inner side of the first inclined reflecting surface portion 34a, a second photoresist layer 14 is formed on a surface of the substrate 10 and the surface is selectively etched to form the second inclined reflecting surface portion 34b and the central reflecting surface portion 32, on which the light source is seated.

These procedures are repeated to form desired reflecting surface 30, and then the substrate 10 is anodized to form insulation layers 35. That is, as shown in FIG. 6(e) and 6(f), the surface of the substrate is anodized to form the insulation layers 35 of $Al_2O_3$.

In this case, if the light source 20 is a vertical type where the LED has an upper electrode connected to the wire and a lower electrode electrically connected to the substrate, anodizing should be excluded on some area of the central reflecting surface portion 32 in order for the light source 20 to be seated and electrically connected to the substrate 10.

Next, the method according to the present invention may further include coating a highly reflective metallic material on the reflecting surface 30. The reflecting surface 30 can be coated with Ag, which is a highly reflective metal.

The multi-stepped reflecting surface portions 34a and 34b can be coated except on the portions of the anodizing insulation layer 35 where the patterned electrodes are to be formed and should be electrically insulated from the patterned electrodes 12a and 13a formed on the anodized insulation layers 35.

Then, the patterned electrodes 12a, 12b, 13a and 13b are formed on the substrate 10. As shown in FIG. 6(g), this step entails forming various forms of patterned electrodes on the anodized insulation layers 35.

The patterned electrodes 12a, 12b, 13a and 13b can be formed in various patterns on the substrate 10 according to the type of LED, i.e., whether it is a horizontal type where the LED has both electrodes connected to the wire or a vertical type where the LED has an upper electrode connected to the wire 40 and a lower electrode placed at the underside thereof to be electrically connected to the underlying substrate 10, and according to the number of LEDs mounted.

After the patterned electrodes 12a, 12b, 13a and 13b are formed, the light source 20 is mounted on the substrate 10 and electrically connected to the patterned electrodes 12a and 12b.

This step is to establish an electric connection through the wire 40 as shown in FIG. 6(h).

FIG. 6(h) exemplifies a vertical type where the light source 20 has an underside surface thereof mounted on the substrate 10 to be supplied with a positive (+) electrode and electrically connected to a negative (−) electrode through the upper patterned electrode 12a electrically insulated from the substrate 10.

In addition, after the light source 20 is electrically connected to the patterned electrodes 12a, 12b, and 13a and 13b, an encapsulant 70 is formed on the substrate 10. This step entails as shown in FIG. 6(i), dispensing and curing a transparent material selected from a silicone resin, an epoxy resin, an Epoxy Molding Compound (EMC), and mixtures thereof in the recessed space of the reflecting surface 30 of the substrate 10.

Such an encapsulant 70 forms a hemispheric upper surface and covers first, second and more steps of inclined reflecting surface portions 34a and 34b or may cover only a single inclined reflecting surface portion 34b.

In addition, the encapsulant 70 can cover first, second or more steps of reflecting surface portions 34a and 34b but with a planar upper surface.

In the LED package 1 having a multi-stepped reflecting surface structure fabricated through the above-described process, a substrate 10 of an Al material is provided under the LEDs of the light source 20, thus resulting in superior hear radiation capacity.

Figure 7:
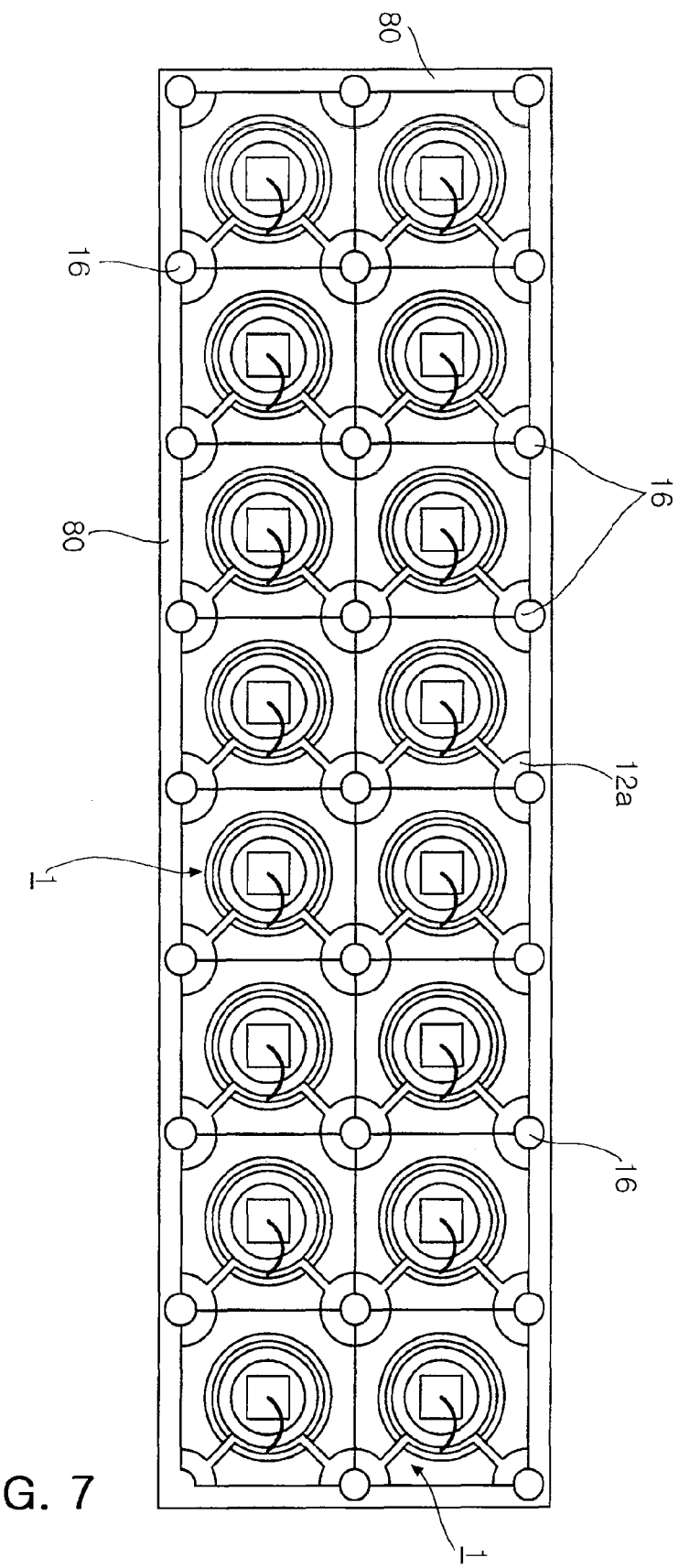
FIG. 7 is a view illustrating the step of simultaneously producing a plurality of the LED packages each having a multi-stepped reflecting surface structure by dicing a mother substrate, according to the present invention.

In the meantime, according to the present invention, the LED package 1 can be fabricated separately one by one, but alternatively, as shown in FIG. 7, a large mother substrate 80 can be diced into the individual packages 1.

That is, the above-described fabrication steps are implemented on each of the packages provided in the single large mother substrate 80, which is then diced to obtain a plurality of the LED packages 1 according to the present invention.

The process of producing a plurality of LED packages 1 using a mother substrate 80 is well known in the art, and thus no further explanation will be provided.

In the LED package having a multi-stepped reflecting surface structure fabricated through the above-described process, the substrate 10 is made of an Al material, and this Al substrate 10 functions as a heat radiator (heat radiating region) 60 of high heat conductivity under the light source 20, thereby achieving superior radiation effect of the heat generated from the light emitting operation of the light source 20.

Moreover, the reflecting surface 30 is formed integrally on the substrate 10, and the encapsulant 70 is easily formed by being injected in the space defined by the reflecting surface, thereby achieving simplified manufacturing process to realize a low cost, high capacity LED package.

According to the present invention set forth above, a substrate is made of an Al material and anodized to form insulation layers thereon, achieving superior heat radiation effect of an LED, thereby significantly increasing the lifetime and light emission efficiency of an LED package.

Furthermore, according to the present invention, a reflecting surface is integrally formed in the substrate in a recessed shape with an encapsulant formed over the reflecting surface, which makes it unnecessary to bond a conventional reflecting member, etc. This allows simplification of the manufacturing process with reduced manufacturing costs.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of fabricating an LED package, comprising:

etching a first surface of a substrate to integrally form a multi-stepped reflecting surface therein, the multi-stepped reflecting surface having a first inclined reflecting surface portion, a central reflecting surface portion, and a second inclined reflecting surface portion extending from the central reflecting surface portion;

anodizing second surfaces of the substrate to form insulation layers on an upper surface of the substrate and on a lower surface of the substrate excluding the central reflecting surface portion and the second inclined reflecting surface portion;

forming patterned electrodes on the insulation layers;

mounting a light source on the central reflecting surface portion of the substrate and electrically connecting the light source to the substrate and the patterned electrodes respectively; and forming an encapsulant over the light source mounted on the substrate, wherein one of the patterned electrodes formed on an upper surface of the insulation layer, which is formed on the upper surface of the substrate, extends from an upper part of the substrate to a middle step of the multi-stepped reflecting surface, without extending beyond the middle step, and is electrically connected with the light source, wherein the etching step comprises:

forming a first photoresist layer on the first surface of the substrate and selectively etching the first surface of the substrate to form the first inclined reflecting surface portion; and forming a second photoresist layer on an inner side of the first inclined reflecting surface portion and selectively etching an inner side surface of the substrate to form the second inclined reflecting surface portion and to form the central reflecting surface portion on which the light source is seated, wherein the first inclined reflecting surface portion and the middle step between the first inclined reflecting surface portion and the second inclined reflecting surface portion have a ring shaped structure surrounding the central reflecting surface portion.

2. The method according to claim 1, wherein the encapsulant forming step comprises dispensing and curing a transparent material selected from the group consisting of a silicone resin, an epoxy resin, an Epoxy Molding Compound (EMC) and mixtures thereof in a recessed space of the reflecting surface of the substrate.

3. The method according to claim 1, further comprising dicing a mother substrate to produce a plurality of LED packages.

4. The method according to claim 1, wherein the substrate is anodized on the second surfaces thereof to form the insulation layers except on the multi-stepped reflecting surface.

5. The method according to claim 1, further comprising coating a highly reflective metallic material on the multi-stepped reflecting surface.

* * * * *